(12) United States Patent
Lee

(10) Patent No.: US 7,595,990 B2
(45) Date of Patent: Sep. 29, 2009

(54) SCANNING APPARATUS WITH HEAT DISSIPATING ABILITY

(75) Inventor: Ta-Yi Lee, Chung-Ho (TW)

(73) Assignee: Lite-On Technology Corporation, Taipei (TW)

( * ) Notice: Subject to any disclaimer, the term of this patent is extended or adjusted under 35 U.S.C. 154(b) by 58 days.

(21) Appl. No.: 11/907,637

(22) Filed: Oct. 16, 2007

(65) Prior Publication Data

US 2008/0180907 A1 Jul. 31, 2008

(30) Foreign Application Priority Data

Jan. 31, 2007 (TW) .............................. 96201890 U

(51) Int. Cl.
*H05K 7/20* (2006.01)
*H04N 1/04* (2006.01)

(52) U.S. Cl. ................... 361/704; 361/688; 361/707; 361/714; 358/474

(58) Field of Classification Search ........................ None
See application file for complete search history.

(56) References Cited

U.S. PATENT DOCUMENTS

| 6,055,158 | A | * | 4/2000 | Pavlovic | .................. 361/704 |
| 6,181,442 | B1 | * | 1/2001 | Ogura et al. | ................. 358/475 |
| 2001/0024299 | A1 | * | 9/2001 | Sawada | ........................ 358/461 |
| 2003/0006362 | A1 | * | 1/2003 | Lee et al. | .................. 250/208.1 |
| 2004/0080797 | A1 | * | 4/2004 | Lee | ............................. 358/509 |
| 2005/0200916 | A1 | * | 9/2005 | Lee et al. | ..................... 358/474 |
| 2006/0087828 | A1 | | 4/2006 | Lin et al. | |
| 2008/0174835 | A1 | * | 7/2008 | Lee | ............................. 358/497 |

FOREIGN PATENT DOCUMENTS

TW            M251986        12/2004

* cited by examiner

*Primary Examiner*—Boris L Chervinsky
(74) *Attorney, Agent, or Firm*—Rosenberg, Klein & Lee

(57) ABSTRACT

A scanning apparatus with heat dissipating ability includes a housing having an opening formed thereon. A cover having a slit, a heating dissipating portion, and supporting portion connected to the heat dissipating portion covers the opening, wherein the supporting portion extends from an edge of the slit into the housing. A light emitting elements is fixed on the supporting portion, for emitting a scanning light through the slit, and the scanning light is reflected as an image light by a document. The image light is converted to image data by an image scanning module. The heat dissipating portion is made of a thermal conductive material to exchange heat with the air, so that heat generated by the light emitting elements is transferred to the heat dissipating portion and the heat is dissipated to the air, the work temperature of the light emitting elements is controlled at an optimal temperature.

17 Claims, 5 Drawing Sheets

SCANNING APPARATUS WITH HEAT DISSIPATING ABILITY

CROSS-REFERENCE TO RELATED APPLICATIONS

This non-provisional application claims priority under 35 U.S.C. §119(a) on Patent Application No(s). 096201890 filed in Taiwan, R.O.C. on Jan. 21, 2007, the entire contents of which are hereby incorporated by reference.

BACKGROUND OF THE INVENTION

1. Field of Invention

The present invention relates to a scanning apparatus, more particularly to a scanning apparatus with heat dissipating ability.

2. Related Art

A scanning apparatus is composed of a housing, a light emitting unit, and an image scanning module. The light emitting unit and the image scanning module are disposed in the housing. The light emitting unit is provided for emitting a scanning light onto a document through a slit formed on the housing. The scanning light is reflected by the document to form an image light according to the image of the document, and the image light is then received by the image scanning module to be converted to an image data.

Generally in the prior art, a cold cathode fluorescent lamp (CCFL) is generally used as the light emitting unit to emit an ideal white with a uniform light intensity distribution. However, a high operating voltage and a high discharge voltage are required to activate the CCFL, so a high voltage driving circuit is required to be disposed in the scanning apparatus for providing a high voltage to drive the CCFL. Therefore, the cost of the scanning apparatus is increased. Moreover, after the CCFL is activated, a period of time is required before the intensity of the emitted light becomes stable. That is to say, after the scanning apparatus using the CCFL is turned on, it is necessary to wait for a period of time for warming-up the CCFL before the scanning apparatus is operated. Furthermore, the intensity of the light emitted by the CCFL is varied with the temperature of the CCFL. If the temperature of the CCFL increases after the scanning apparatus performs uninterrupted operation, the intensity of the emitted light may also change, and even the spectrum of the light shifts, such that the emitted light is not the ideal white light anymore, and the image scanning quality under the uninterrupted operation of the scanning apparatus is inconsistent.

Currently, the light emitting diodes (LEDs) have been widely applied to provide the scanning light, and through the arrangement of the LED array, the LEDs are made to generate the scanning light with a uniform light intensity distribution. Meanwhile, the LED is not limited to the white light LED capable of emitting the ideal white light, but for example, the ideal white light can be obtained by combining various LEDs which emits single color scanning lights such as red, green, and blue lights.

However, the LEDs generate a large amount of heat during emitting light, such that the application of the LEDs is limited. The heat generated by the LEDs negatively affects the other components in the scanning apparatus, and the scanning apparatus may be malfunctioned due to the heat generated by the LEDs. Take the negative effect on LEDs themselves as an illustration, the intensity and the spectrum of the light emitted by the LEDs are varied when the temperature of the LEDs rises to a critical temperature, and the image scanning quality is also negatively affected due to the variation of the intensity and the spectrum of the emitting light. Meanwhile, the rising temperature may also negatively affect the electro-luminescent material in the LEDs. The decay time of the electro-luminescent material in the LEDs is shortened, and the life span of the LEDs is also shortened. In addition, the circuit connected to the LEDs may be burnt out due to the affect of the high temperature.

In order to solve the problem caused by heat generation of the LEDs, the common solution is to reduce the quantity of the LEDs of a LED array and to enlarge the interval between two neighboring LEDs. However, this solution greatly reduces the intensity of the light emitted by the LED array, and makes the intensity distribution of the emitted light be non-uniform, so that the image scanning quality is also negatively affected.

As for dissipating heat generated by the LEDs, US Patent Publication No. US2006/0087828 (also disclosed as ROC Taiwan Patent No. TWM251986) provides a light-emitting diode lamp with high heat dissipation, which is used as the light source required by the scanning apparatus. US2006/0087828 includes a thermal conductivity cavity, a transparent cover, and a plurality of LEDs. The thermal conductivity cavity has a rectangular opening, and a reflective pattern is formed in the thermal conductivity cavity corresponding to the opening. The transparent cover is equipped to cover the opening of the thermal conductivity cavity, and the LEDs are disposed on one end or both ends of the thermal conductivity cavity to emit the scanning light, such that the scanning light is reflected by the reflective pattern to pass through the opening. However, in US2006/0087828, the LEDs horizontally emit the light, and then the light is reflected by the reflective pattern to the opening, such that the light intensity distribution uniformity along the opening is relatively poor. Therefore, the transparent material such as the epoxy resin is requires to be filled in the thermal conductivity cavity to act as the light-guide element, so as to improve the light intensity distribution of the LEDs. However, the transparent material, such as epoxy resin, is easily affected by the high temperature of the LEDs directly, as a result, the material is increasingly deteriorated to become non-transparent, and thus losing the light-guide ability, and directly blocking the lights emitted by the LEDs.

SUMMARY OF THE INVENTION

In view of the above problems, the object of the present invention is to provide a scanning apparatus having heat dissipating ability, for rapidly dissipating heat generated by light emitting units of the scanning apparatus.

In order to achieve the above object, a scanning apparatus having heat dissipating ability is provided for scanning an image of a document and converting the image to an image data. The scanning apparatus includes a housing, a cover, a light-emitting unit, and an image scanning module. The housing has an opening formed on a top surface thereof, and has a containing space defined therein. The cover has a slit, a heat dissipating portion, and a supporting portion connected to the heat dissipating portion. The cover is fixed on the top surface of the housing and covers the opening. The supporting portion extends from an edge of the slit of the cover into the containing space of the housing, and forms a recessed supporting space. The light-emitting unit includes a substrate and a plurality of light emitting elements. The substrate is fixed on the supporting portion, and located in the supporting space. The light emitting elements are disposed on the substrate in an array (in one or more rows) for emitting a scanning light onto the document through the slit, such that the scanning light is reflected by the document to form an image light. The image scanning module is disposed in the containing space of the housing, for receiving and converting the image light to an image data. The heat dissipating portion is made of a thermal conductive material, for example, metal or alloy, for exchanging heat with the air, so that the heat generated by the light emitting elements is transferred to the heat dissipating portion through the substrate and the supporting portion, and the heat is dissipated to the air.

The advantage of the present invention is that the light emitting unit is disposed on the supporting portion while the supporting portion extends from an edge of the slit of the cover, such that the scanning light is emitted onto the document after passing through the slit directly or after be reflected, which significantly simplifies the structure of the scanning apparatus. The heat generated by the light emitting unit is directly conducted to the heat dissipating portion through the supporting portion, and thus being dissipated to the air. The surface area of the heat dissipating portion can be determined according to the heat generation rate of the light emitting unit, so as to obtain the require heat dissipating performance, and control the work temperature of the light emitting unit at an optimal temperature.

Furthermore, the light emitting unit of the present invention can be rapidly positioned on a predetermined position of the cover, in which a plurality of first positioning parts is formed on an edge of the substrate while a plurality of second positioning parts corresponding to the first positioning parts is formed on the supporting portion of the cover. The first positioning parts and the second positioning parts can be engaged with each other, such that the substrate can be quickly assembled and positioned at the predetermined position on the supporting portion, and thus achieving the efficacy of the quick assembly modularization.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
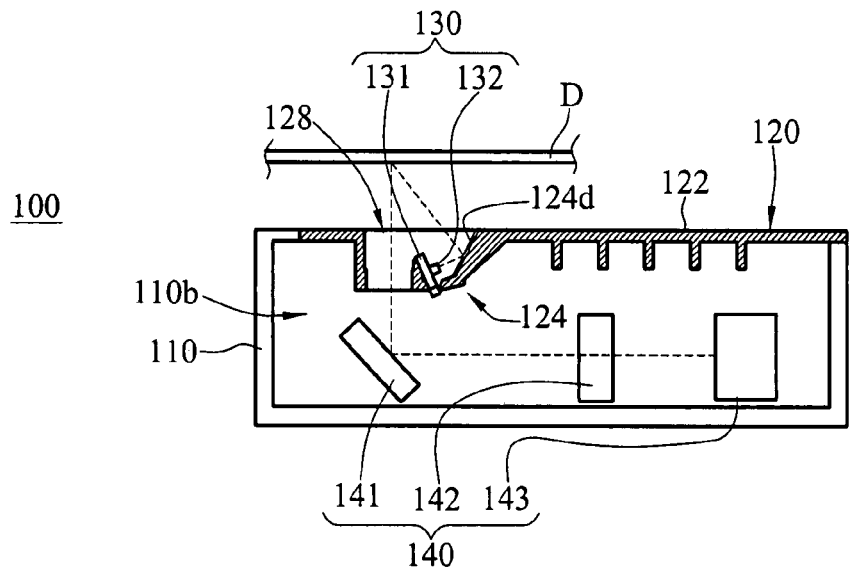
FIGS. 1 and 2 are schematic sectional views of a first embodiment of the present invention.
Figure 2:
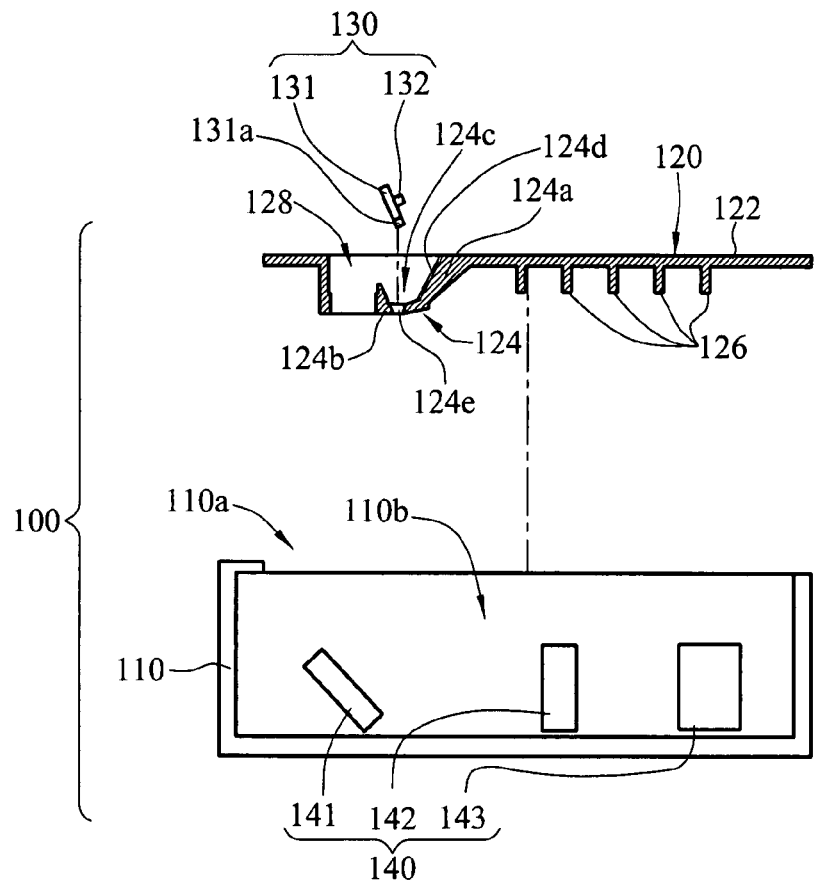
Figure 3:
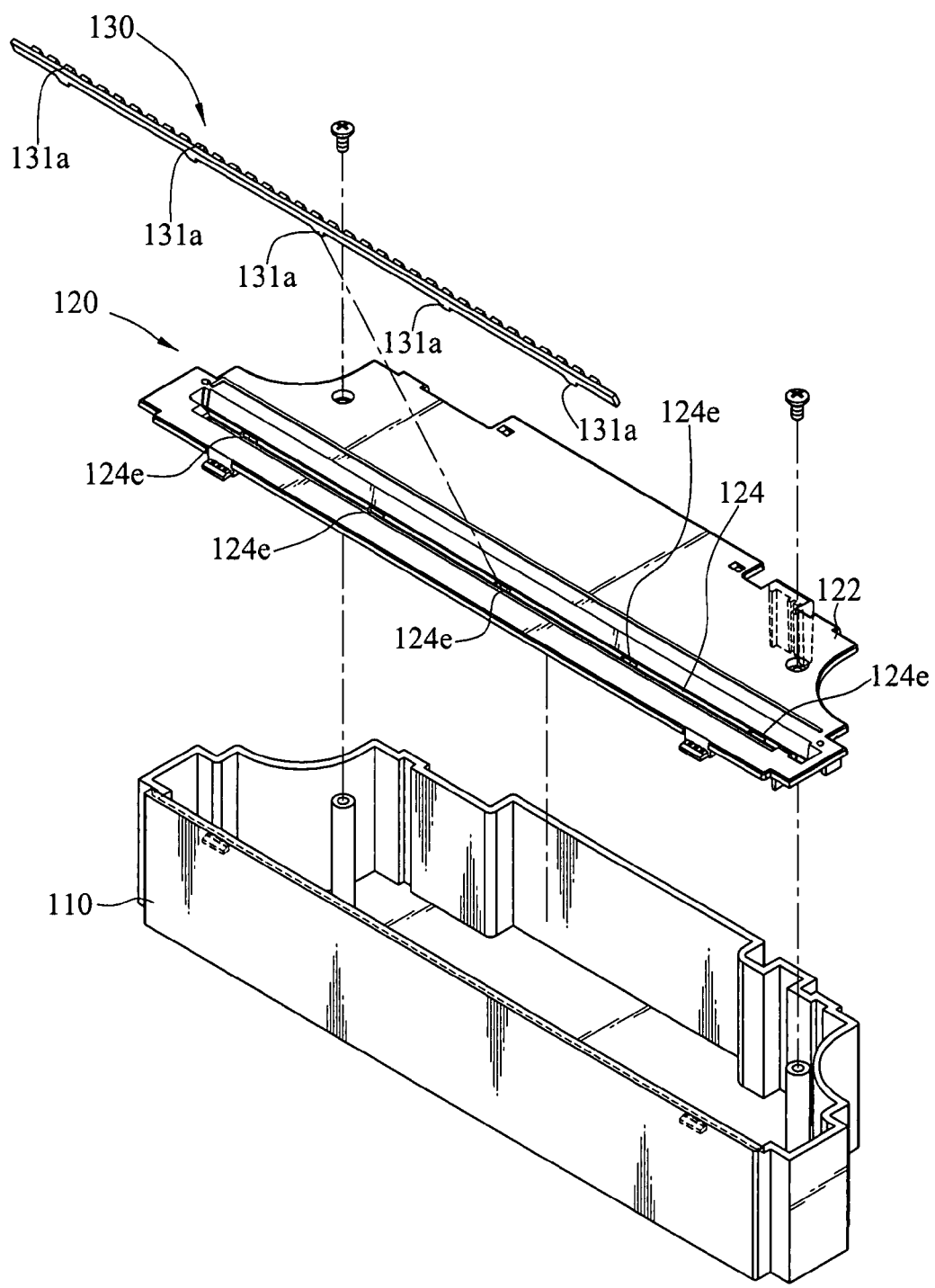
FIG. 3 is an exploded stereogram of a cover and a light emitting unit according to the first embodiment of the present invention.
Figure 4:
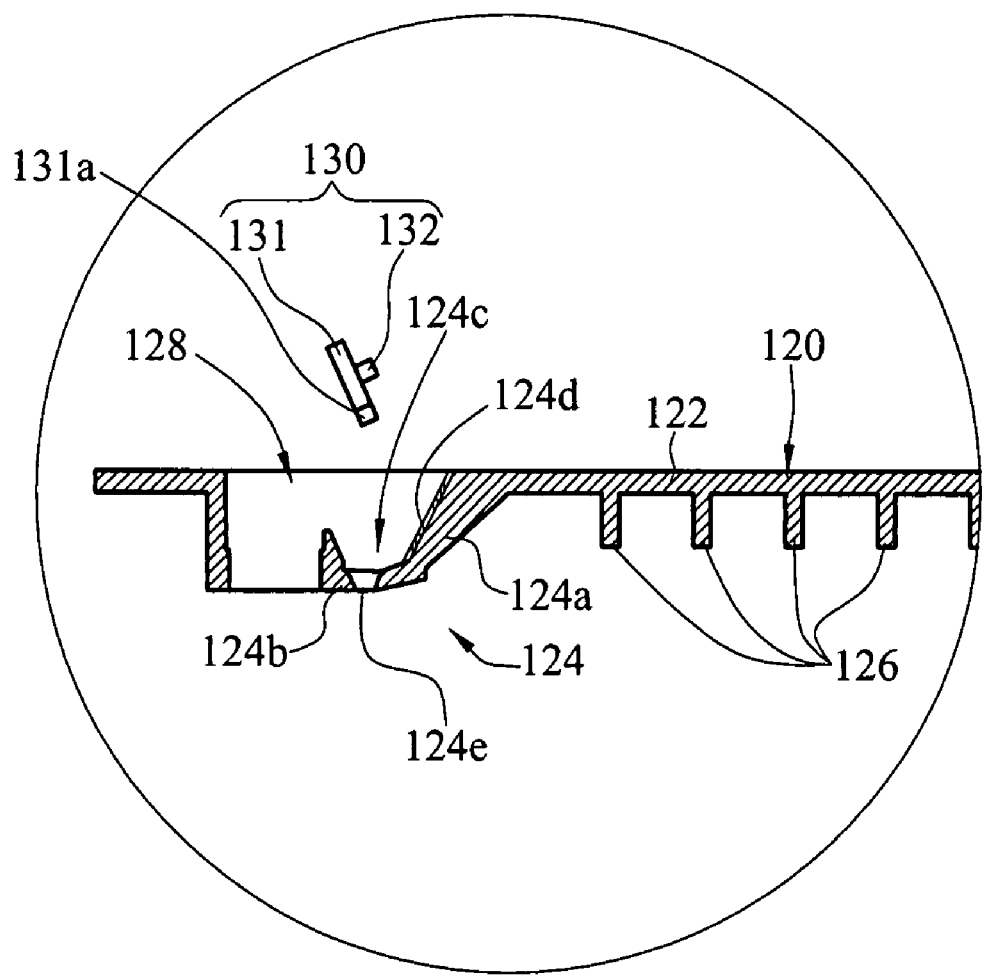
FIG. 4 is a partial enlarged view of a part of the elements in FIG. 1.

Referring to FIGS. 1, 2, 3, and 4, a scanning apparatus 100 having heat dissipating ability according to a first embodiment of the present invention is provided, for scanning an image of a document D and converting the image to an image data. The scanning apparatus 100 includes a housing 110, a cover 120, a light emitting unit 130, and an image scanning module 140.

The housing 110 has an opening 110a formed on a top surface thereof, and has a containing space 110b formed therein, wherein the image scanning module 140 is disposed in the containing space 110b of the housing 110.

The cover 120 has a slit 128, a heat dissipating portion 122, and a supporting portion 124 connected to the heat dissipating portion 122. The supporting portion 124 extends from an edge of the slit 128 of the cover 120 into the containing space 110b of the housing 110, so as to form a recessed supporting space 124c. The light emitting unit 130 has a substrate 131 and a plurality of light emitting elements 132, for example, LEDs which emit light as point light source. The substrate 131 is fixed on the supporting portion 124, and located in the supporting space 124c. The light emitting elements 132 are disposed on the substrate 131 in an array (being in one or more rows), for emitting a scanning light onto the document D through the slit 128 of the cover 120, and then the scanning light is reflected by the document D to form an image light. The image scanning module 140 disposed in the containing space 110b of the housing 110 is provided for receiving and converting the image light to an image data. The heat dissipating portion 122 is made of a thermal conductive material, such as metal or alloy, for exchanging heat with the air, so that the heat generated by the light emitting elements 132 of the light emitting unit 130 is transferred to the heat dissipating portion 122 through the substrate 131 and the supporting portion 124 having a high thermal conductivity. It should be noted that, the cover 120 may be monolithically formed by the thermal conductivity material, such as metal or alloy. Alternatively, the heat dissipating portion 122 is made of thermal conductivity material, while the supporting portion 124 is made of plastic and jointed to the heat dissipating portion 122, so as to form the cover 120. Thus the cover 120 is formed by a plurality of elements made of different material jointed together.

The cover 120 is fixed on the top surface of the housing 110, by means of screws, latches, or adhering, to cover the opening 110a of the housing 110. The heat dissipating portion 122 of the cover 120 is planar for providing a heat-exchanging area to contact with the air, which increases the heat convection coefficient for the heat exchange between the heat dissipating portion 122 and the air. A plurality of concave and convex heat sink structures 126 (referring to FIG. 6) are formed on the inner surface or the outer surface of the heat dissipating portion 122, for example, fins, bumps, ribs, or sandblasting surface, so as to increase the surface area of the heat dissipating portion 122, and thus enhancing the heat transfer between the heat dissipating portion 122 and the air.

Referring to FIGS. 1, 2, 3, and 4, the position of the slit 128 is adjacent an edge of the heat dissipating portion 122, and is formed with long-narrow opening area for the scanning light to pass through. The supporting portion 124 has a first extending section 124a extending from an edge of the slit 128, and a second extending section 124b extending from an edge of the first extending section 124a, so as to form a supporting space 124c. A reflecting surface 124d is formed on a side of the first extending section 124a facing the supporting space 124c, so as to reflect the scanning light to pass through the slit 128 onto the surface of the document D outside the housing 110. The second extending section 124b is provided for the light emitting unit 130 to be disposed thereon and located in the supporting space 124c, so that the light emitting unit 130 contacts with the supporting portion 124 and emits the scanning light onto the reflecting surface 124d, and then the scanning light is reflected by the reflecting surface 124d to pass through the slit 128 onto the document D outside the housing 110. Thus, according to the image on the surface of the document D, the scanning light is reflected to form the image light and the image light travels through the slit 128. The width of the slit 128 is larger than the horizontal width of the part of the supporting portion 124 under the slit 128, such that the opening area formed by the slit 128 is only partly shielded by the supporting portion 124, which allows the image light to pass through the slit 128 and enter into the housing 110.

Referring to FIGS. 1, 2, 3, and 4, the substrate 131 of the light emitting unit 130 is fixed on one side of the second extending section 124b corresponding to the reflecting surface 124d. Each light emitting elements 132 is a light-emitting element emitting light from a point therein, such as an LED, a bulb, for emitting the scanning light onto the reflecting surface 124d. Then, the scanning light travels to the exterior of the housing 110 through the slit 128 after being reflected by the reflecting surface 124d. A plurality of first positioning parts 131a is formed from an edge of the substrate 131, and a plurality of second positioning parts 124e corresponding to the first positioning parts 131a is formed on the supporting portion 124 of the cover 120. The first positioning parts 131a and the second positioning parts 124e are engaged with each other, so as to position the substrate 131 at a predetermined position on the supporting portion 124, and thus, the substrate 131 be quickly placed at the predetermined position on the supporting portion 124. And further, the substrate 131 can be fixed on the supporting portion 124 by means of glue, screws, latches, buckling. In the embodiment of this invention, the first positioning parts 131a are bumps extending from the edge of the substrate 131, and the second positioning parts 124e are depressions formed on the surface of the second extending section 124b of the supporting portion 124. The substrate 131 can be quickly assembled and positioned by means of embedding the first positioning parts 131a into the second positioning parts 124e.

The image scanning module 140 includes a reflecting mirror 141, a focusing element 142, and an image sensor 143. The reflecting mirror 141 is provided for reflecting the image light to change the traveling direction of the image light, such that the image light travels towards the image sensor 143. In addition to changing the traveling direction of the image light, another function of the reflecting mirror 141 is to extend the length of the light path of the image light, so as to focus the image light by the focusing element 142. The number of the reflecting mirror 141 can be one or more than one, and at least one of the reflecting mirrors 141 is disposed below the slit 128 of the cover 120, such that the image light passing through the slit 128 is incident onto the reflecting mirror 141 and reflected. The focusing element 142 and the image sensor 143 are disposed in the housing 110 for receiving the image light reflected by the reflecting mirror 141. The focusing element 142 is located ahead of the image sensor 143, such that after being incident into the focusing element 142, the image light is focused on the image sensor 143 by the focusing element 142. The focusing element 142 may be a convex lens, a columnar lens, or a lens set composed of a plurality of lenses. The position of the image sensor 143 in the housing 110 is determined by the light path of the image light, in this embodiment, the image sensor 143 is a charge coupled device (CCD). The image scanning module 140 may also be composed of a single image sensor, for example, a contact image sensor (CIS) is used as the image scanning module 140, thus saving the focusing procedure and the long light path required for focusing. That is, the reflecting mirror 141 and the focusing element 142 can be removed.

Referring to FIGS. 1, 2, 3, and 4, the cover 120 of the present invention includes a heat dissipating portion 122 made of a thermal conductivity material having a high thermal conductivity coefficient. Because of light emitting from the light emitting elements 132 of the light emitting unit 130 usually accompanying heat, the heat is conducted to the supporting portion 124 through the substrate 131, and then, it is quickly conducted to the heat dissipating portion 122 through the supporting portion 124. The area contacted with the air of the heat dissipating portion 122 is larger than that of the supporting portion 124, the substrate 131, or the light emitting elements 132, so the heat dissipating portion 122 exchanges heat with the air rapidly, such that the heat generated by the light emitting elements 132 is dissipated by the heat convection, and thus control the work temperature of the light emitting unit 130 at an optimal temperature. Therefore, the intensity and the spectrum of the light emitted by the light emitting unit 130 are not changed due to the changing of the temperature, so as to optimize the image scanning quality.

Figure 5:
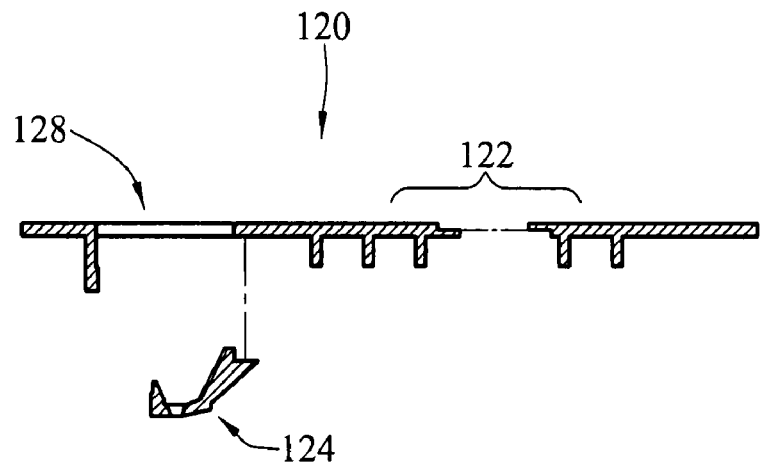
FIG. 5 is a schematic exploded view of the cover according to the first embodiment of the present invention.

Referring to FIG. 5, the cover 120 can be monolithically formed by the thermal conductivity material, such as metal or alloy, and formed by means of punching or casting, etc. In addition, it may also be formed by a plurality of elements made of different materials jointed together. For example, firstly, the heat dissipating portion 122 and the supporting portion 124 having a high thermal conductivity feature are respectively fabricated. Next, the slit 128 is formed corresponding to an edge of the heat dissipating portion 122. Then, the supporting portion 124 is jointed to the edge of the slit 128 and connected to the heat dissipating portion 122. The heat sink surface area of the heat dissipating portion 122 can be enlarged by joining a plurality of metal elements. Alternatively, the cover 120 is formed by jointing a part of the plastic element made of a plastic material with the heat dissipating portion 122 and the supporting portion 124 made of the thermal conductivity material. For example, firstly, the plastic element (not shown), the heat dissipating portion 122 and the supporting portion 124 made of the thermal conductivity material are respectively fabricated; next, the slit 128 is formed corresponding to an edge of the heat dissipating portion 122. Then, the supporting portion 124 is jointed to the edge of the slit 128 and connected to the heat dissipating portion 122. Finally, the plastic element and the heat dissipating portion 122 are jointed together to form a cover 120.

Figure 6:
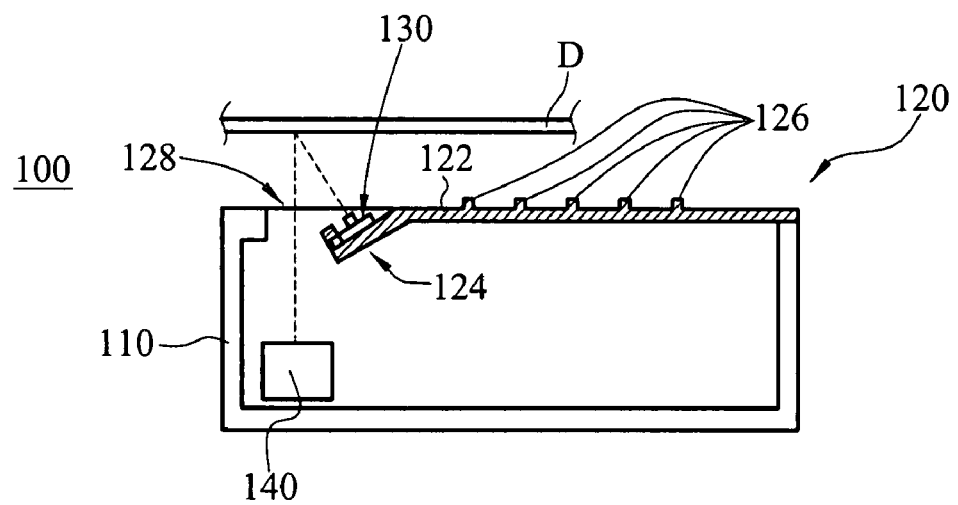
FIG. 6 is a schematic section view of a second embodiment of the present invention.

As shown in FIG. 6, a scanning apparatus 100 having heat dissipating ability according to a second embodiment of the present invention is provided. The scanning apparatus 100 is provided for scanning an image of a document D, and converting the image to the image data. The scanning apparatus 100 includes a housing 110, a cover 120, a light emitting unit 130, and an image scanning module 140. The cover 120 is fixed on the top surface of the housing 110 to cover the opening thereof, and has a slit 128, a heat dissipating portion 122 made of the thermal conductivity material, and a supporting portion 124 connected to the heat dissipating portion 122. The slit 128 is located corresponding to an edge of the heat dissipating portion 122, and is formed with a long-narrow opening area, for the light to pass through. The supporting portion 124 extends from an edge of the slit 128 of the cover 120 into the containing space 110b of the housing 110. A plurality of concave or convex heat sink structures 126, for example, fins, bumps, ribs, or sandblasting surfaces, is formed on the surface of the heat dissipating portion 122, so as to enlarge the surface area of the heat dissipating portion 122 and to increase the heat convection coefficient.

The supporting portion 124 is provided for supporting the light emitting unit 130, such that the light emitting unit 130 contacts with the supporting portion 124 and emits a scanning light through the slit 128. The scanning light passing through the slit 128 is emitted outside the housing 110 and onto the surface of the document D. Then, according to the image of the document D, the scanning light is reflected to form an image light and enters into the housing 110 through the slit 128. In this embodiment of the invention, the image scanning module 140 is a CIS. The length of the light path required by the CIS is smaller than that for the CCD, so that the CIS can be disposed in the containing space 110b of the housing 110 and located below the slit 128 of the cover 120, for directly receiving the image light, and converting it to the image data. The light emitting unit 130 is disposed on the supporting portion 124, and the heat generated by the light emitting unit 130 is conducted to the heat dissipating portion 122 through the supporting portion 124, and dissipated to the air through heat exchange between the heat dissipating portion 122 and the air, and thus, controlling the work temperature of the light emitting unit 130 at an optimal temperature.

Figure 7:
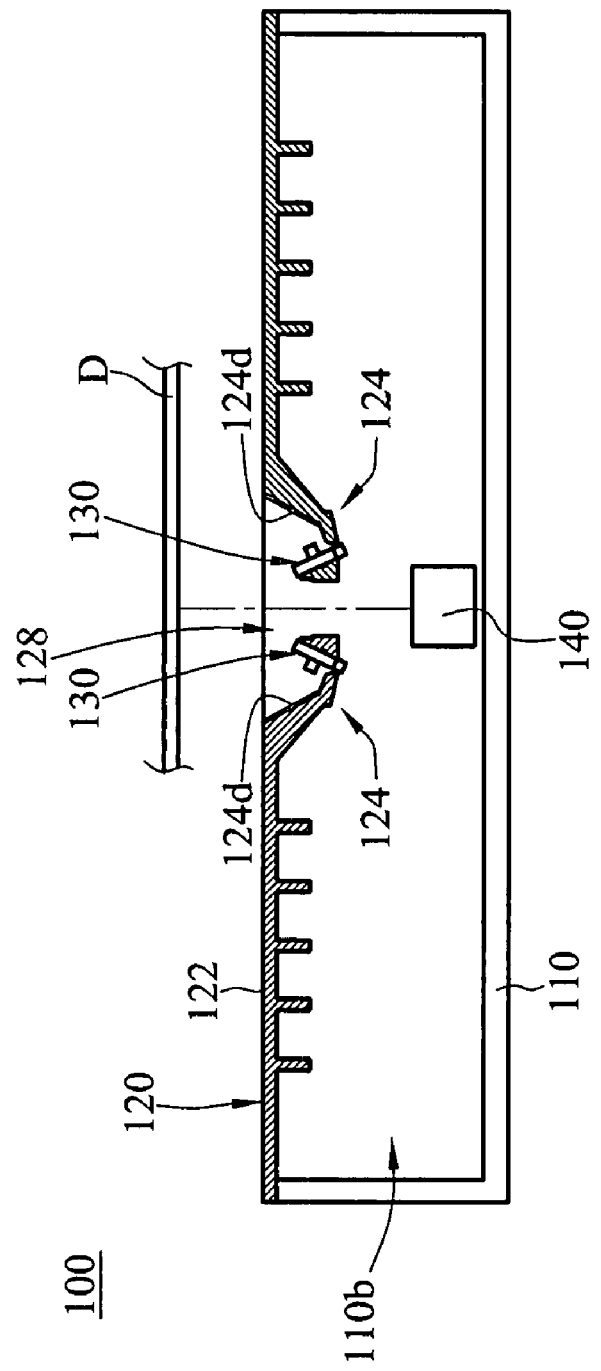
FIG. 7 is a schematic sectional view of a third embodiment of the present invention.

Referring to FIG. 7, a scanning apparatus 100 according to a third embodiment of the present invention is provided. The scanning apparatus 100 is provided for scanning an image of a document D and converting the image to the image data. The scanning apparatus 100 includes a housing 110, a cover 120, two light emitting units 130, and an image scanning module 140. The cover 120 is fixed on the top surface of the housing 110 to cover the opening of the housing 110, and has a slit 128, a heat dissipating portion 122, and two supporting portions 124 connected to the heat dissipating portion 122. The heat dissipating portion 122 is divided by the slit 128 into two regions for performing the heat exchange with the air. The slit 128 is formed with a long-narrow opening area, for the light to pass through. The two supporting portions 124 respectively extend from two opposite edges of the slit 128 of the cover 120, and extend into the containing space 110b of the housing 110. Each supporting portion 124 is provided for supporting one of the two light emitting units 130, such that each light emitting units 130 contacts with the supporting portion 124 and emits a scanning light respectively. Therefore, the scanning light directly passes through the slit 128, or is reflected by the reflecting surface 124d of each supporting portion 124 and then passes through the slit 128, to reach the document D outside the housing 110. The heat generated by the two light emitting units 130 is conducted to the two heat dissipating portions 122 through the two supporting portions 124, and then dissipated to the air through heat exchange between the heat dissipating portion 122 and the air, so as to control the work temperature of light emitting unit 130 at an optimal temperature.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A scanning apparatus with heat dissipating ability, for scanning a document, comprising:
    a housing, having an opening formed on a top surface of the housing, and having a containing space defined therein;
    a cover, fixed on the top surface of the housing for covering the opening, and having a slit, a heat dissipating portion, and a supporting portion connected to the heat dissipating portion, wherein the supporting portion extends from an edge of the slit into the containing space of the housing;
    a light emitting unit, comprising;
        a substrate, fixed on the supporting portion wherein a plurality of first positioning parts is formed on an edge of the substrate, a plurality of second positioning parts corresponding to the first positioning parts is formed on the supporting portion of the cover, and the first positioning parts and the second positioning parts are engaged with each other, so as to position the substrate on the supporting portion;
        a plurality of light emitting elements, disposed on the substrate, for emitting a scanning light to the document through the slit, such that the scanning light is reflected to form an image light, wherein the heat generated by the light emitting elements is transferred to the heat dissipating portion through the substrate and the supporting portion; and
    an image scanning module, disposed in the containing space, for receiving and converting the image light to an image data.

2. The scanning apparatus with heat dissipating ability as claimed in claim 1, wherein the cover is monolithically formed by a thermal conductive material, wherein the thermal conductive material is metal or alloy.

3. The scanning apparatus with heat dissipating ability as claimed in claim 1, wherein the cover is formed by a plurality of elements made of different materials jointed together.

4. The scanning apparatus with heat dissipating ability as claimed in claim 1, wherein the width of the slit is larger than the horizontal width of a part of the supporting portion under the slit.

5. The scanning apparatus with heat dissipating ability as claimed in claim 1, wherein the heat dissipating portion is planar.

6. The scanning apparatus with heat dissipating ability as claimed in claim 1, wherein a plurality of heat sink structures is formed on an inner or outer surface of the heat dissipating portion.

7. The scanning apparatus with heat dissipating ability as claimed in claim 6, wherein the heat sink structures are selected from the group consisting of fins, bumps, ribs, and sandblasting surfaces.

8. The scanning apparatus with heat dissipating ability as claimed in claim 1, wherein the supporting portion has a first extending section extending from the edge of the slit, and a second extending section extending from an edge of the first extending section, and a recessed supporting space is defined by the first extending section and the second extending section.

9. The scanning apparatus with heat dissipating ability as claimed in claim 1, wherein the light emitting elements are disposed on the substrate in an array.

10. The scanning apparatus with heat dissipating ability as claimed in claim 8, wherein a reflecting surface is formed on a side of the first extending section facing the supporting space, and the light emitting elements emits the scanning light onto the reflecting surface, such that the scanning light is reflected to the document by the reflecting surface.

11. The scanning apparatus with heat dissipating ability as claimed in claim 1, wherein the light emitting elements of the light emitting unit are disposed on the supporting portion and face to the slit to emit the scanning light through the slit, such that the scanning light passes through the slit onto the document outside the housing.

12. The scanning apparatus with heat dissipating ability as claimed in claim 1, wherein the position of the slit is located adjacent to the edge of the heat dissipating portion and formed with a long-narrow opening area.

13. The scanning apparatus with heat dissipating ability as claimed in claim 1, wherein the heat dissipating portion is divided into two regions by the slit, and the slit is formed with an long-narrow opening area.

14. The scanning apparatus with heat dissipating ability as claimed in claim 1, wherein each light emitting element is a light emitting diode or a bulb.

15. The scanning apparatus with heat dissipating ability as claimed in claim 1, wherein the first positioning parts are bumps extending along the edge of the substrate, the second positioning parts are depressions formed on the surface of the supporting portion, and the first positioning parts are embedded into the second positioning parts.

16. The scanning apparatus with heat dissipating ability as claimed in claim 1, wherein the heat dissipating portion is made of a thermal conductive material.

17. The scanning apparatus with heat dissipating ability as claimed in claim 16, wherein the thermal conductive material is metal or alloy.

* * * * *